United States Patent [19]

Gheewala

[11] Patent Number: 4,459,495

[45] Date of Patent: Jul. 10, 1984

[54] JOSEPHSON CURRENT REGULATOR

[75] Inventor: Tushar R. Gheewala, Yorktown Heights, N.Y.

[73] Assignee: International Business Machines Corporation, Armonk, N.Y.

[21] Appl. No.: 280,146

[22] Filed: Jun. 30, 1981

[51] Int. Cl.[3] ........................ H03K 17/92; H03L 5/00

[52] U.S. Cl. .................................... 307/306; 307/277; 307/296 R; 307/541; 323/360; 357/5

[58] Field of Search ................... 307/306, 296 R, 476, 307/541, 277; 323/360; 357/5; 365/162

[56] References Cited

U.S. PATENT DOCUMENTS

| | | | |
|---|---|---|---|
| 3,209,172 | 9/1965 | Young | 307/88.5 |
| 3,953,749 | 4/1976 | Baechtold et al. | 307/306 |
| 4,012,646 | 3/1977 | Fang et al. | 307/306 |
| 4,092,553 | 2/1976 | Fang et al. | 307/306 |

OTHER PUBLICATIONS

IBM Technical Disclosure Bulletin, vol. 19, No. 1, Jun. 1976, p. 370, "Regulators With Feedback Control" by D. J. Herrell and G. M. Koppelman.

*Primary Examiner*—John Zazworsky
*Attorney, Agent, or Firm*—Carl C. Kling

[57] ABSTRACT

A Josephson current regulator circuit is described for regulating the gate current to a Josephson load device. The regulator circuit is located between the source of the gate current and the Josephson load, and is comprised of Josephson devices having a critical current less than the critical current of the Josephson load device. Each of the Josephson regulator devices has at least two states dependent upon the magnitude of the gate current. A resistance is associated with each of the Josephson regulator devices so that, when the state of the Josephson regulator device is changed, resistance is either introduced or removed from the circuit connecting the source and the Josephson load. This adjusts the magnitude of the gate current and maintains within a specified range the ratio of the gate current to the critical current of the Josephson load device.

1 Claim, 14 Drawing Figures

280,146
FIG.3
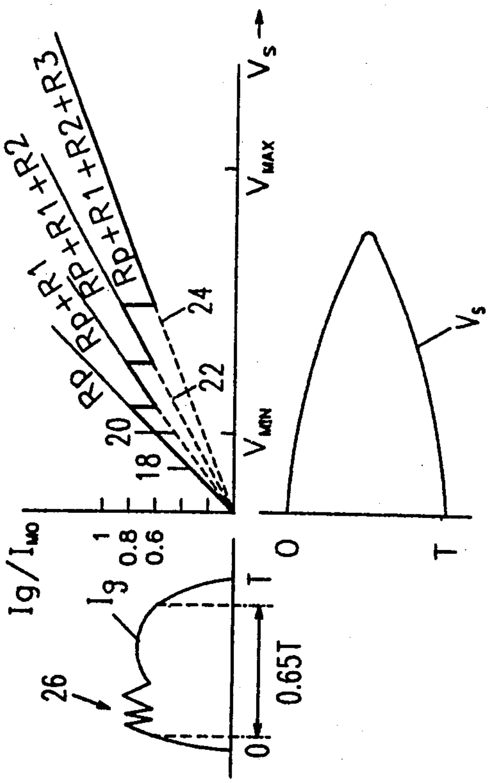
FIG.1
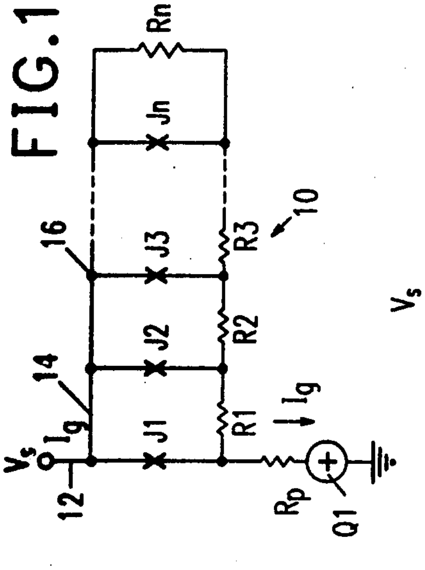
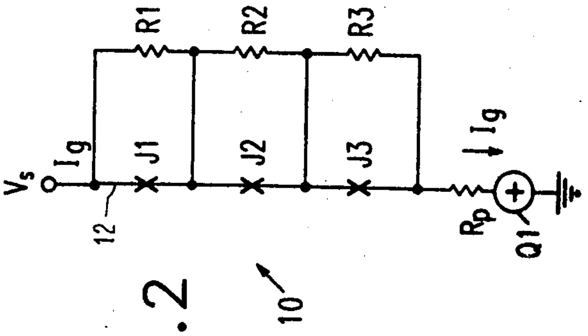
FIG.2

JOSEPHSON CURRENT REGULATOR

DESCRIPTION

1. Technical Field

This invention relates to superconductive circuits employing devices exhibiting a Josephson current, and more particularly to a circuit for providing current regulation of the gate current provided to Josephson load devices.

2. Background Art

Regulation of current and voltage applied to electronic circuits is an important consideration in the design of these circuits, and particularly when there are many of the same circuits on a single chip or on a plurality of chips. It is often the situation that the fabrication process used to make the circuits does not yield devices having identical characteristics. Thus, it is often the situation that various device parameters will vary across the circuit chip, or from chip to chip. Since many circuits on the same chip or on different chips are powered from the same current or voltage sources, variations in the device parameters can cause these circuits to operate differently, even though it is intended that they operate identically to one another.

In particular, superconducting circuits using Josephson devices are very fabrication-dependent, having many parameters which vary with the particular steps used in the fabrication process. For example, the tunneling current through a Josephson device varies exponentially with the thickness of the tunnel barrier, and also depends upon the materials which are used. Since the tunnel barrier is very thin (approximately 50 angstroms), such barriers are difficult to make reproduceably; therefore Josephson devices on a chip, or on different chips, often have different current densities. Since these devices are often powered from the same current or voltage sources, variations in these parameters can cause different operating characteristics and therefore affect the overall system operation.

While Josephson current density is mentioned as a parameter which is particularly important and difficult to compensate for in the power supply networks, other parameters can affect the uniformity of certain operations across the entire chip, or from chip to chip. Such other parameters include the resistance or resistivity of impedance elements in the circuit, and variations in the voltage provided by power supply networks.

Voltage regulators for Josephson device circuits are known in the art, reference being made to, for example, IBM Technical Disclosure Bulletin Vol. 19, No. 1, June 1976, page 370, and U.S. Pat. No. 4,092,553 (regulator 14 shown in FIG. 3 thereof). These voltage regulators typically are a string of series connected Josephson devices each of which switch to the gap voltage $V_g$. Since the gap voltage of each device is assumed to be the same because all of the devices are made in the same fabrication process, a precise voltage $nV_g$ is developed across the load, where n is the number of Josephson devices in the regulator string.

Regulators of this type using a series string of Josephson junctions connected in parallel with the voltage source do not, and cannot provide current regulation. For example, if the Josephson current density of the various load devices supplied from a particular voltage source vary in any way from device to device, the aforementioned voltage regulators do not compensate for varying load conditions.

A current regulator designed to provide regulation for temperature changes in a cryogenic circuit is described in U.S. Pat. No. 3,209,172. In that regulator, a superconductive material is electrically in parallel with a circuit including a normal metal. As temperatures change, the resistance state of the superconductor element changes to influence the amount of current applied as a control current to a cryotron device. This circuit cannot and will not work to compensate for changes in the gate current applied to the load cryotron. It merely provides a control current dependent upon temperature changes and in no way will correct for errors introduced by the fabrication process used to make the cryotron logic devices.

Another type of power supply circuit is shown in U.S. Pat. No. 4,012,646. In this circuit a "regulator" device 18 is used to provide a disturb signal which cancels an earlier produced disturb signal, in order to provide constant voltage to the logic circuit. This circuit will not provide a constant gate current to the logic device and is not sensitive to gate current changes across an entire chip, or from chip to chip.

Accordingly, it is a primary object of the present invention to provide a precise current regulator for Josephson device circuitry.

It is another object of the present invention to provide a current regulator for Josephson load networks located on the same or different chips, in which networks the ratio of the gate current to the load devices with respect to the critical currents of these devices is precisely controlled.

It is another object of the present invention to provide a current regulator for Josephson load networks, using Josephson regulator devices that can be fabricated at the same time and in the same process steps used to make the Josephson devices in the Josephson load networks.

It is another object of the present invention to provide a regulator circuit comprised of Josephson devices, connected in series or parallel, which can have the same or different critical currents, and which are used to compensate for changes of any type in Josephson load networks connected to said regulator circuit.

Another object of the invention is to make use of a predetermined relationship of critical currents of Josephson devices in the regulator circuit and of Josephson devices in the Josephson load network so that the Josephson load network can participate in its own gate current regulation.

DISCLOSURE OF THE INVENTION

A power supply network is provided using a correlated current regulator that provides good regulation of current through a Josephson load network for variations in parameters such as applied voltage, Josephson current density, resistance, etc. Regulation is provided on the chip in which the Josephson load network is located, as well as between interconnected chips.

The power supply network is comprised of a voltage source (either AC or DC), a Josephson load network, and a correlated current regulator located between the voltage source and the Josephson load network. The regulator comprises an echelon of superconductive regulator sets each exhibiting two states of different impedance, there being an impedance connected across each of said regulator devices in each regulator set Depending upon the magnitude of the voltage applied to the power supply network, the echelon of regulator sets will be activated in sequence to introduce additional impedances in the regulator circuit, or to decrease the impedance associated with the regulator circuit. In turn, this keeps the current delivered to the Josephson load network within a specified range.

The current regulator circuit connected between the power supply and the Josephson load network is comprised of at least one regulator device having an impedance connected to the regulator device, where the impedance is connected into and out of the supply circuit to the Josephson load network, depending on the state of the regulator devices. In a preferred embodiment, the echelon of regulator sets are capable of supporting a Josephson current therethrough, and can be single or multiple junction Josephson devices. The regulator devices switch successively as the current to the Josephson load network changes. This produces successive changes in the resistance seen by the power source so that, as the power source voltage changes, the current through the Josephson load network will stay within a preselected range.

In a series connected embodiment, the regulator circuit comprises an echelon of regulator sets connected in series between the power supply and the Josephson load network. In a parallel-connected embodiment, the regulator devices are arranged in parallel to one another, the parallel arrangement of regulator devices being connected across the current path between the power source and the Josephson load network.

These and other objects, features, and advantages of the present invention will be more apparent from the following more particular description of the preferred embodiments.

BRIEF DESCRIPTION OF THE DRAWINGS

FIG. 1 is a circuit diagram of a preferred embodiment for the inventive power supply network, using a parallel-connected current regulator.

FIG. 2 is a circuit diagram of another embodiment of the inventive power supply network, using a series-connected current regulator.

FIG. 3 illustrates the current regulation properties of the circuit, and shows an unregulated power supply waveform $V_s$, a regulator gate current $I_g$ through the Josephson load, and a plot of $I_g/I_{mo}$, where $I_{mo}$ is the design critical current of the Josephson load Q1 shown in FIGS. 1 and 2.

FIGS. *7a–7c* are plots of $I_g/I_{mo}$ versus $V_s$ for various values of the Josephson current density $J_1$ of the Josephson load network, and are used to illustrate how the gate current $I_g$ is correlated to Josephson current density variations by the present regulator circuit.

Figure 8A:
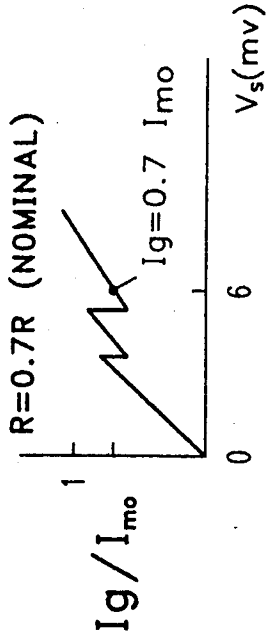
Figure 8B:
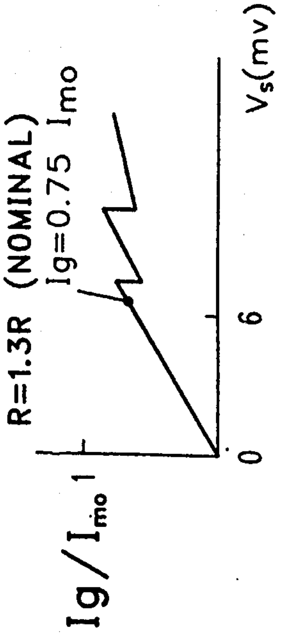

FIGS. 8A and 8B are current-voltage diagrams illustrating current regulation when the resistivity (resistance) varies across the device chip, or from chip to chip.

Figure 9:
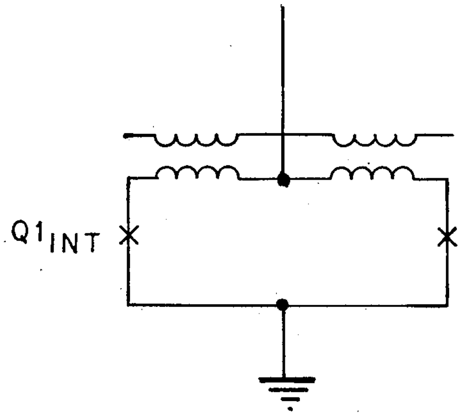

FIG. 9 illustrates schematically a Josephson load network of multiple Josephson load networks connected in series.

FIG. 10 illustrates schematically a Josephson load network of multiple Josehson load networks connected in parallel.

FIG. 11 illustrates schematically a Josephson load network comprising a Josephson interferometer.

BEST MODE FOR CARRYING OUT THE INVENTION

In general, a load network comprising a Josephson current device requires that the current through it be kept within a certain specified range in order to prevent erroneous operation of the load device. Thus, the gate current $I_g$ through the load must be controlled to be within a specified amount of the maximum current $I_{mo}$ which the Josephson load can handle without switching its state. To achieve this, a current regulator circuit is connected between the voltage source supplying the drive voltage $V_s$ and the Josephson load network. The regulator circuit comprises a group of regulator sets, typically having a Josephson device with zero-voltage and nonzero-voltage states, and at least one resistor connected across the Josephson device. As the applied voltage varies, the Josephson devices in successive regulator sets will be successively switched to a different voltage state and will introduce or remove resistance from the circuit which connects the power supply source to the Josephson load. Thus, the current $I_g$ delivered to the Josephson load network will be kept within a specified range, even though the supply voltage varies. As will be more apparent later, the regulator devices can be either latching or nonlatching devices in the practice of the present invention. If they are latching devices, the additional resistances switched into the supply circuit to the Josephson load network will remain in the circuit until the power supply voltage sufficiently decreases to cause resetting of the regulator devices. If the regulator devices are nonlatching, they will introduce resistance into the power supply circuit to the load for a period of time determined by the circuit parameters. In either case, regulation of the gate current $I_g$ to the Josephson load network will result, the amount of regulation depending upon the number of regulator devices and additional resistances provided for insertion and removal into the circuit which delivers current to the Josephson load network. With these general principles in mind, the specific embodiments illustrated in the drawings will now be discussed.

FIG. 1 shows the preferred embodiment of a power supply network using a correlated current network between the power supply $V_s$ (not shown) and the Josephson load network Q1. The correlated current regulator network 10 is comprised of a plurality of regulator sets including devices J1, J2, J3, . . . , Jn, which are typically Josephson devices having at least two voltage states representing a low and a high impedance. These Josephson devices can be single junction devices, multijunction devices, interferometers, in-line gates, etc. In the embodiment of FIG. 1, the devices J1–Jn can have identical characteristics. For example, all of the regulator devices can have identical design critical currents $I'_{mo}$. This means that the devices J1–Jn can be made in the same fabrication steps and can have the same geometry, etc. In contrast with this, the regulator devices J1–J3 of the circuit in FIG. 2 are slightly different from one another so that they will have different critical currents.

A power supply resistor $R_p$ is shown, although this is not a necessary component of the power supply network. It is merely used to set the magnitude of the gate current $I_g$ delivered to the Josephson load network Q1. Q1 is a network exhibiting a Josephson current and can be, for instance, an interferometer comprised of multiple junctions. It has multiple states and is switchable therebetween by the magnitude of the gate current $I_g$ as well as by the application of external control signals, in a manner well known in the art. Because the state of device Q1 depends upon the magnitude of the current $I_g$, it is important to regulate closely the magnitude of $I_g$ with respect to the critical current $I_{mo}$ of Josephson load network Q1. This is accomplished by the regulator circuit 10, where the critical current $I'_{mo}$ of devices J1–Jn is less than $I_{mo}$.

In operation, a nominal current $I_g$ will be provided in the circuit of FIG. 1 to Josephson load network Q1 when regulator device J1 is in its zero-voltage state. However, when $V_s$ increases, the current delivered to J1 at an entry node along conductor 12 will increase, causing J1 to switch to its nonzero-voltage state. Since this is a high impedance state, current $I_g$ will no longer flow through J1, but will be diverted along conductor 14 to the Josephson device J2, which is in its zero-voltage state. This current will then flow through J2 and through the resistance R1 before passing through an exit node to $R_p$ and load Q1. Thus, switching of device J1 to its nonzero-voltage state introduces a resistance R1 in the power supply circuit delivering current $I_g$ to the Josephson load network. The addition of resistance R1 means that the current $I_g$ is kept within certain limits even though $V_s$ has increased.

Regulator circuit 10 is comprised of resistances R2, R3, . . . Rn, in addition to resistor R1. These resistances R2–Rn are successively introduced into the power supply network depending on the magnitude of $V_s$. For example, if the magnitude of $V_s$ continues to increase, additional current will flow through J2, causing it to switch to its voltage state. When this occurs, most of the current along conductor 12 will be delivered to node 16, and will then pass through regulator device J3. The current will then pass through resistances R2 and R1 before passing through Josephson load network Q1. This means that additional resistances R1+R2 are introduced in the power supply network to provide further regulation of the current $I_g$ through the load.

As mentioned previously, the critical currents of the regulator devices J1–Jn can be equal in the circuit of FIG. 1. When J1 switches, an additional resistance R1 will be introduced into the power supply network and, thus, the current delivered to J2 will not be sufficient to cause switching of that device. It is only when $V_s$ continues to increase that the current delivered to J2 will be sufficient to switch it. When that occurs, J2 switches and introduces another resistance R2 into the power supply network. This means that the current then delivered to J3 will not be enough to switch it to its voltage state. Again, only when $V_s$ continues to increase will enough current be provided to J3 to switch it. Thus, even though the regulator devices J1–Jn have identical properties, they will switch in sequence depending upon the value of the voltage $V_s$. Of course, it should be understood that J1–Jn can have different critical currents and still provide this sequential switching action.

FIG. 2 is an electrical diagram of a series-connected regulator circuit 10 comprising the regulator devices J1, J2, and J3, as well as the shunt connected resistors R1, R2, and R3. A voltage source (not shown) provides the supply voltage $V_s$ to Josephson load Q1, through the regulator circuit 10 and the supply resistor $R_p$. As with the embodiment of FIG. 1, the supply voltage $V_s$ can be an AC voltage or a DC voltage, and can be either regulated or unregulated. Typically, $V_s$ is provided to several load devices Q1 in parallel, where the load devices are located on the same chip, or on different chips. Due to many factors, including fabrication tolerances, parameters such as the resistance $R_p$ and the Josephson current density $J_1$ can vary from circuit to circuit or from chip to chip. Thus, regulator circuit 10 is useful since it takes into account these variations and provides a regulated gate current $I_g$ through each of the Josephson load devices in Josephson load network Q1, regardless of the change in the supply voltage $V_s$.

In contrast with the circuit of FIG. 1, the regulator devices J1–J3 of FIG. 2 preferably have different properties, and particularly different critical currents. The critical current of J1 is preferably less than that of J2, which in turn is less than that of J3. For example, if the critical current of the Josephson load device Q1 is $I_{mo}$, than the critical currents of regulator devices J1–J3 can be, for example, 0.8 $I_{mo}$, 0.825 $I_{mo}$, and 0.85 $I_{mo}$, respectively. The nominal gate current bias level of Q1 is 0.73 $I_{mo}$. Regulator devices J1–J3 switch sequentially to keep $I_g$ from exceeding $I_{mo}$. Every time a regulator device J1, J2, J3 switches to a voltage state, its associated shunt resistance becomes connected in series with the power supply resistor $R_p$. The shunt resistors R1, R2, and R3 are chosen so that $I_g$ does not fall below, for example, 0.6 $I_{mo}$ upon switching of the regulator devices J1–J3. This operation is identical to that described previously with respect to the circuit of FIG. 1.

FIG. 3 shows a current—voltage plot (I-V)—for the circuit of FIG. 2, using three regulator devices J1–J3. $I_g/I_{mo}$ is plotted against $V_s$, where $V_s$ and $I_g$ are shown. From these figures, it is apparent that the gate current $I_g$ remains below $I_{mo}$ and above 0.6 $I_{mo}$ for a duty cycle of 65 percent.

In more detail, when devices J1–J3 are in their zero-voltage state, the current $I_g$ follows the curve 18 having a slope $R_p$. Assuming the critical currents for J1–J3 mentioned above, when $I_g$ exceeds 0.8 $I_{mo}$, J1 will switch to its voltage state and introduce R1 in series with $R_p$. Thus, the current $I_g$ will drop quickly and switch to that given by the curve 20, which has a slope $R_p$+R1. When $V_s$ continues to increase to a value where $I_g$ is 0.825 $I_{mo}$, J2 will switch to its voltage state and add resistance R2 in series with R1 and $R_p$. The current delivered to the load Q1 will then drop rapidly and follow the curve 22, having slope $R_p$+R1+R2.

When the voltage $V_s$ increases to a level where $I_g$ equals 0.85 $I_{mo}$, J3 will switch to its voltage state and introduce R3 in the power supply circuit. Thus, $I_g$ will fall rapidly to a value given by curve 24, which has a slope $R_p$+R1+R2+R3.

When the supply voltage decreases, regulator devices J3, J2, J1 will reset their zero-voltage values to remove the resistances R3, R2 and R1 from the circuit. Since it is desired to keep $I_g$ between 0.6 $I_{mo}$ and $I_{mo}$, it is apparent that $V_s$ can have values between $V_{min}$ and $V_{max}$, indicated in FIG. 3. This is a larger range of values than would be possible if the regulator circuit 10 were not provided.

FIG. 3 shows the unregulated supply waveform $V_s$ and the gate current waveform $I_g$, for a 65 percent duty cycle. The variations 26 on the leading edge of the waveform $I_g$ are the variations produced when regulator devices J1–J3 are introduced in series with $R_p$. In that $I_g$ waveform, the falling edge does not show variations such as variations 26 on the leading edge of the waveform. This is because it is assumed that devices J1–J3 are latching devices which hold their voltage state until the AC waveform $V_s$ decreases. Of course, nonlatching devices can be used in which case similar types of variations would be found in the falling edge of the $I_g$ waveform.

Figure 4:
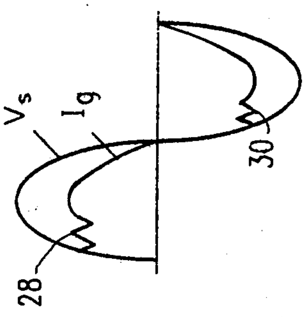
FIG. 4 is a schematic illustration of a simulation of the regulator circuit of the present invention for a sinusidal voltage input $V_s$. The gate current $I_g$ through the Josephson load is shown for both positive and negative supply voltage $V_s$.

FIG. 4 illustrates correlated regulation of the gate current $I_g$ for an applied sinusidal supply waveform $V_s$. The regulator includes two regulator junctions J1 and J2. As the regulator devices switch into their voltage states, adjustments 28 occur in the $I_g$ waveform. As $V_s$ increases with a negative polarity, variations 30 appear in the $I_g$ waveform; thus, regardless of the polarity of $V_s$, regulation of the current $I_g$ is obtained.

Figure 5:
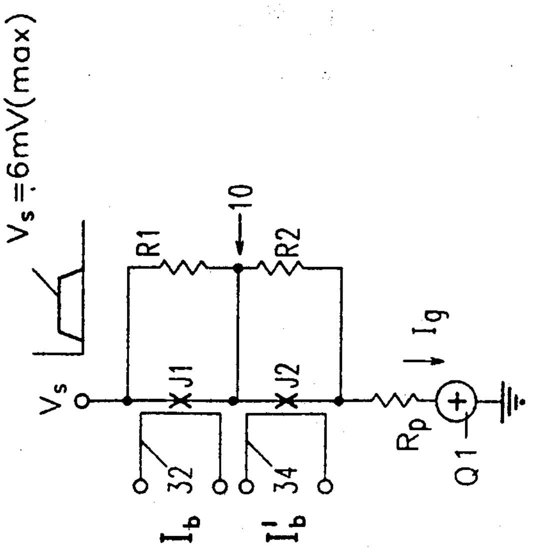
FIG. 5 is a circuit diagram of a power supply regulator using two regulator devices which are externally biased, where the supply voltage is a regulated voltage. The circuit is used to illustrate the effect of the current regulator circuit on the duty cycle of the gate current $I_g$.

FIG. 5 shows a series connected regulator 10 comprised of two regulator devices J1 and J2, having shunt connected resistances R1 and R2. In this example, a regulated voltage $V_s$ (6 mV max) is applied. Current $I_g$ flows through supply resistor $R_p$ and then to Josephson load device Q1.

In contrast with the previous regulator circuit embodiments, regulator devices J1, J2 can be biased by application of control currents $I_b$ and $I'_b$, respectively, in overlaying conductors 32 and 34. The presence of these bias currents means that the critical currents of J1 and J2 can be externally adjusted, thus providing even more sensitivity to variations in $I_{mo}$, resistance, and power supply voltage.

The operation of the circuit of FIG. 5 is identical to that described previously. Thus, switching of J1 introduces resistance R1 in series with $R_p$, while switching of J2 introduces resistance R2.

In a particular embodiment, the critical current of Q1 is $I_{mo}$, while the critical current of J1 is 0.8 $I_{mo}$. The critical current of J2 is 0.9 $I_{mo}$. R1 is 10.5 ohms, R2 is 17 ohms, and $R_p$ is 32 ohms.

Figure 6:
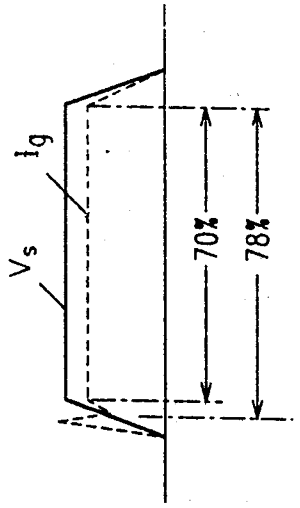
FIG. 6 is a plot of a regulated supply voltage $V_s$ and the resulting gate current $I_g$ through the Josephson load network in the circuit of FIG. 5, and illustrates the improvement of duty cycle which can result through the use of the present current regulator.

For a 6 mV (max) applied voltage, the waveforms of $V_s$ and $I_g$ are shown in FIG. 6. From this, it is apparent that the duty cycle of the $I_g$ waveform is increased if J1 and J2 are latching devices. The reason for this is the following: when $V_s$ is increasing in value, only $R_p$ is in the circuit delivering current to Q1. Since this is a small resistance, the slope of $I_g$ is steep and $I_g$ will reach acceptable levels for circuit operations quickly.

Another advantage results when latching devices are used for J1 and J2. In this situation, the additional resistances R1 and R2 introduced in series with $R_p$ will produce a larger resistance as the waveform $V_s$ decreases in amplitude. This means that the slope of the $I_g$ waveform will be less steep during its fall time. This helps to reduce the occurrence of "punch-through", which is an adverse effect that is more likely to occur if the fall time of the $I_g$ is rapid. In this effect, Josephson devices are apt to not reset to their zero-voltage states as $I_g$ decreases, unless $I_g$ decreases slowly. When latching devices are used as the regulator devices, the resistance added to the circuit remains as $I_g$ decreases, and therefore the fall time of $I_g$ is longer than its rise time. Thus, the likelihood of punch-through is reduced.

Figure 7A:
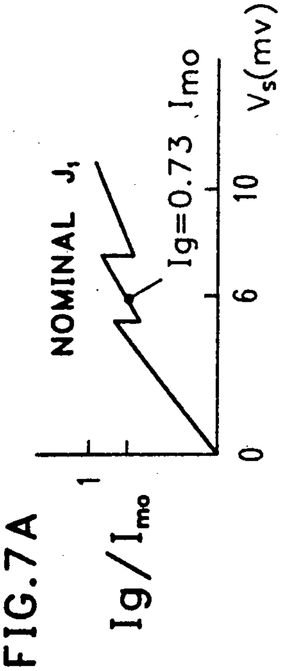
Figure 7B:
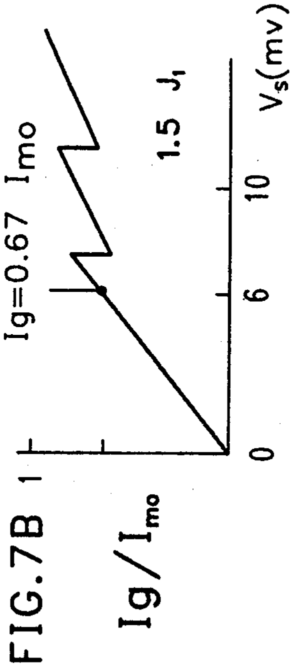
Figure 7C:
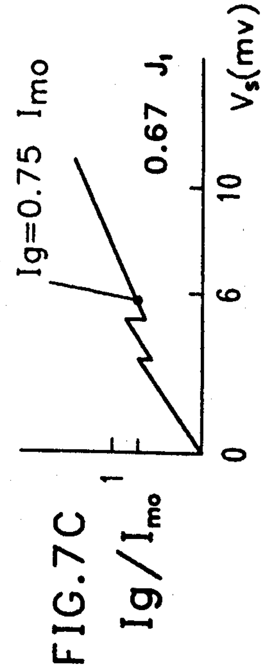

FIGS. 7A–7C illustrate correlated regulation of current with changes in supply voltage $V_s$, for different values of Josephson current density $J_1$. These figures plot $I_g/I_{mo}$ versus $V_s$, for three values of the current density $J_1$. The circuit of FIG. 5, having the electrical component values mentioned above, was used to obtain these curves.

The Josephson current density generally depends upon the tunnel barrier fabrication, for Josephson devices having tunnel barriers. This in turn depends upon the materials used and the thickness of the tunnel barrier. Since the current density $J_1$ varies exponentially with tunnel barrier thickness, small variations in thickness can cause wide variations in $I_g$. Thus, where many circuits are powered in parallel from the same source, a good current regulator must be able to regulate the gate current even if the Josephson current density varies across the chip, or from chip to chip.

In FIGS. 7A–7C, a regulated 6 mV voltage is provided. FIG. 7A shows the I-V curve for a nominal value of current density $J_1$. At 6 mV, the curve for the operating point $I_g=0.73\ I_{mo}$ has a slope determined by $R1+R_p$.

FIG. 7B shows the I-V curve when the Josephson current density is increased to 1.5 $J_1$. In this figure, the operating point has been increased so that $I_g=0.67\ I_{mo}$, at $V_s=6$ mV. This point lies on a curve whose slope is dependent upon $R_p$.

FIG. 7C shows the I-V curve when the Josephson current density is reduced to a value 0.67 $J_1$. In this situation, the operating point at 6 mV yields $I_g=0.75\ I_{mo}$ and the operating point lies on a curve whose slope is determined by the sum of the three resistances: $R1+R2+R_p$.

The provision of a regulator circuit which will accurately take into account variations in Josephson current density is very important for superconductive Josephson logic circuits. If their resistances $R_p$ have a fixed value then, without the regulator circuit, it would be impossible to correct the gate current for variations in $J_1$ or $I_{mo}$. This is particularly true where fabrication tolerances lead to variations in $J_1$ and $I_{mo}$ from one device to another on a chip, or from chip to chip.

FIGS. 8A and 8B are used to illustrate the change in operating point of the circuit to take into account changes in resistivity from one circuit to another, etc. The operation in this situation is similar to that when the Josephson current density $J_1$ changes. That is, the regulator circuit of this invention works well to keep the gate current within a specified range regardless of the parameter which may vary across a chip, or from chip to chip. Since these parameters are largely fabrication dependent, the present current regulator provides good overall margins.

FIGS. 8A and 8B are current-voltage curves derived from operation of the circuit of FIG. 5, where that circuit has the electrical component values listed previously.

In FIG. 8A, the resistance is 0.7 times a nominal value. For $V_s=6$ mV, the operating point yields $I_g=0.7\ I_{mo}$. The curve for this operating point is one where the total series resistance in the power supply network is $R1+R2+R_p$.

In FIG. 8B, the resistance is increased over its nominal value and has a value 1.3 times the nominal value. The operating point is now on a curve where only $R_p$ is in the power supply circuit, and the gate current is 0.75 $I_{mo}$.

Since the operation of the current regulator of the present invention depends upon the value of the current through the circuit, it will track variations in the gate current regardless of the source of these variations. In this manner, any parameter which varies across a chip or from chip to chip, for any reason whatsoever, will be compensated for by this regulation technique.

FIG. 9 shows a two-junction Josephson interferometer Q1 INT. Various Josephson load configurations are possible; they may be generally considered as a group identified as Josephson load network Q1 in FIG. 1.

In the practice of this invention, it will be appreciated by those of skill in the art that Josephson devices are the preferred regulator devices, especially if the load devices are Josephson devices. For example, the load device can be a four junction interferometer while the regulator devices are three junction interferometers. The regulator devices and the Josephson load devices can be fabricated in the same steps and still have different critical currents. For example, the area and geometry of the regulator Josephson devices can be made different from that of the Josephson load devices so that the critical currents of the regulator Josephson devices are less than that of the Josephson load devices.

While this invention has been described with respect to certain embodiments thereof, it will be appreciated by those of skill in the art that other embodiments can be envisioned using the general principles of this invention.

Having thus described my invention, what I claim as new, and desire to secure by Letters Patent is:

1. A Josephson power regulated load network characterized by (a) a voltage source (unregulated current source) $V_S$;

(b) a Josephson load network Q1 having a design critical current $I_{mo}$; and (c) a Josephson regulator network interconnecting said voltage source and said Josephson load network, comprising a plurality of interconnected Josephson regulator sets, each regulator set having:

an entry node and an exit node, the entry node being operatively connected to the voltage source or to the related exit node of an intervening Josephson regulator set;

a shunt resistance operatively connected between said entry node and said exit node; and an included Josephson device, operatively connected to said entry node, having a Josephson junction which exhibits plural states, one of which states is a zero voltage state and another of which states is a finite voltage state; and means connecting said shunt resistance and said included Josephson device in parallel, said Josephson device having a design critical current $I'_{mo}$; less than that of said Josephson load device Q1;

whereby the unregulated current flows through one or more of said Josephson regulator sets selectively according to the instantaneous state, zero voltage or finite voltage, of the included Josephson device.

* * * * *